(12) United States Patent
Lopatin et al.

(10) Patent No.: US 6,534,865 B1
(45) Date of Patent: Mar. 18, 2003

(54) METHOD OF ENHANCED FILL OF VIAS AND TRENCHES

(75) Inventors: Sergey D. Lopatin, Santa Clara, CA (US); Pin-Chin Connie Wang, Menlo Park, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/880,219

(22) Filed: Jun. 12, 2001

(51) Int. Cl.[7] ............................................. H01L 21/321
(52) U.S. Cl. ...................... 257/751; 257/762; 438/677
(58) Field of Search ............................... 438/618, 622, 438/677, 678, 687; 257/773, 774, 750, 751, 753, 762

(56) References Cited

U.S. PATENT DOCUMENTS

| | | | |
|---|---|---|---|
| 5,897,368 A | * | 4/1999 | Cole, Jr. et al. ............ 438/678 |
| 6,110,817 A | * | 8/2000 | Tsai et al. ................... 438/618 |
| 6,218,303 B1 | * | 4/2001 | Lin ............................. 438/687 |
| 6,239,021 B1 | * | 5/2001 | Pramanick et al. ......... 438/627 |
| 6,258,695 B1 | * | 7/2001 | Dunn et al. ................. 438/528 |
| 6,300,236 B1 | * | 10/2001 | Harper et al. ............... 438/618 |
| 6,340,633 B1 | * | 1/2002 | Lopatin et al. ............. 438/625 |
| 6,342,447 B1 | * | 1/2002 | Hoshino ...................... 438/687 |
| 6,352,938 B2 | * | 3/2002 | Chen et al. ................. 438/725 |
| 2001/0010401 A1 | * | 8/2001 | Koyama et al. ............ 257/751 |

FOREIGN PATENT DOCUMENTS

JP 10-125678 * 5/1998 ....... H01L/21/3205

OTHER PUBLICATIONS

T. Andryuschenko et al., Electroless and Electrolytic Seed Repair Effects on Damascene Feature Fill. IEEE 2001, pp. 33–35.*

* cited by examiner

*Primary Examiner*—Long Pham
*Assistant Examiner*—Anh Duy Mai
(74) *Attorney, Agent, or Firm*—Mikio Ishimaru

(57) ABSTRACT

A manufacturing method and apparatus for filling vias and trenches in integrated circuits is provided having a substrate with a device provided thereon. A device dielectric layer is formed on the semiconductor substrate. A channel dielectric layer on the device dielectric layer has an opening provided therein. A barrier layer lines the opening of the channel dielectric. A seed layer is deposited over the barrier layer. Portions of the seed layer are then doped with a material that inhibits the deposition of copper by electroplating or electroless deposition using ion implantation. A conductor core layer is deposited on the seed layer by electroplating or electroless deposition, filling the opening over the barrier layer. The inhibiting material on the doped seed layer creates a filling profile that allows for a more efficient, faster, void-free filling of the conductor core layer.

10 Claims, 6 Drawing Sheets

METHOD OF ENHANCED FILL OF VIAS AND TRENCHES

TECHNICAL FIELD

The present invention relates generally to integrated circuits and more particularly to controlling interconnect channel thickness therein.

BACKGROUND ART

In the manufacture of integrated circuits, after the individual devices such as the transistors have been fabricated in and on the semiconductor substrate, they must be connected together to perform the desired circuit functions. This interconnection process is generally called "metallization" and is performed using a number of different photolithographic, deposition, and removal techniques.

In one interconnection process, which is called a "dual damascene" technique, two interconnect channels of conductor materials are separated by interlayer dielectric layers in vertically separated planes perpendicular to each other and interconnected by a vertical connection, or "via", at their closest point. The dual damascene technique is performed over the individual devices which are in a device dielectric layer with the gate and source/drain contacts extending up through the device dielectric layer to contact one or more channels in a first channel dielectric layer.

The first channel formation of the dual damascene process starts with the deposition of a thin first channel stop layer. The first channel stop layer is an etch stop layer which is subject to a photolithographic processing step which involves deposition, patterning, exposure, and development of a photoresist, and an anisotropic etching step through the patterned photoresist to provide openings to the device contacts. The photoresist is then stripped. A first channel dielectric layer is formed on the first channel stop layer. Where the first channel dielectric layer is of an oxide material, such as silicon oxide ($SiO_2$), the first channel stop layer is a nitride, such as silicon nitride (SiN), so the two layers can be selectively etched.

The first channel dielectric layer is then subject to further photolithographic process and etching steps to form first channel openings in the pattern of the first channels. The photoresist is then stripped. An optional thin adhesion layer is deposited on the first channel dielectric layer and lines the first channel openings to ensure good adhesion of subsequently deposited material to the first channel dielectric layer.

For conductor materials such as copper, which are deposited by electroplating, a seed layer is deposited on the barrier layer and lines the barrier layer in the first channel openings to act as an electrode for the electroplating process. Processes such as electroless, physical vapor, and chemical vapor deposition are used to deposit the seed layer.

A first conductor material is deposited on the seed layer and fills the first channel opening. The first conductor material and the seed layer generally become integral, and are often collectively referred to as the conductor core when discussing the main current-carrying portion of the channels.

A chemical-mechanical polishing (CMP) process is then used to remove the first conductor material, the seed layer, and the barrier layer above the first channel dielectric layer to form the first channels. An abrasiveless chemical is used for the chemical-mechanical polishing process in order to prevent abrasives from being left in the channel. When a layer is placed over the first channels as a final layer, it is called a "capping" layer and a "single" damascene process is completed. When the layer is processed further for placement of additional channels over it, the layer is a via stop layer.

The via formation step of the dual damascene process starts with the deposition of a thin via stop layer over the first channels and the first channel dielectric layer. The via stop layer is an etch stop layer which is subject to photolithographic processing and anisotropic etching steps to provide openings to the first channels. The photoresist is then stripped.

A via dielectric layer is formed on the via stop layer. Again, where the via dielectric layer is of an oxide material, such as silicon oxide, the via stop layer is a nitride, such as silicon nitride, so the two layers can be selectively etched. The via dielectric layer is then subject to further photolithographic process and etching steps to form the pattern of the vias. The photoresist is then stripped.

A second channel dielectric layer is formed on the via dielectric layer. Again, where the second channel dielectric layer is of an oxide material, such as silicon oxide, the via stop layer is a nitride, such as silicon nitride, so the two layers can be selectively etched. The second channel dielectric layer is then subject to further photolithographic process and etching steps to simultaneously form second channel and via openings in the pattern of the second channels and the vias. The photoresist is then stripped.

An optional thin adhesion layer is deposited on the second channel dielectric layer and lines the second channel and the via openings. A barrier layer is then deposited on the adhesion layer and lines the adhesion layer in the second channel openings and the vias. Again, for conductor materials such as copper and copper alloys, a seed layer is deposited by electroless deposition on the barrier layer and lines the barrier layer in the second channel openings and the vias.

A second conductor material is deposited on the seed layer and fills the second channel openings and the vias.

A CMP process is then used to remove the second conductor material, the seed layer, and the barrier layer above the second channel dielectric layer to form the first channels. When a layer is placed over the second channels as a final layer, it is called a "capping" layer and the "dual" damascene process is completed.

The layer may be processed further for placement of additional levels of channels and vias over it. Individual and multiple levels of single and dual damascene structures can be formed for single and multiple levels of channels and vias, which are collectively referred to as "interconnects".

The use of the single and dual damascene techniques eliminates metal etch and dielectric gap fill steps typically used in the metallization process. The elimination of metal etch steps is important as the semiconductor industry moves from aluminum (Al) to other metallization materials, such as copper, which are very difficult to etch.

A major problem occurs in this process is related to the lengthy process of forming a barrier layer, copper seed layer, and copper conductor core. Physical vapor deposition of the barrier layer and the copper seed layer is very non-conformal, meaning that it does not conform in a uniform manner to the surface of the dielectric layer on which it is deposited. Other layers, such as the copper conductor layer, are more conformal and is deposited using electroplating. This becomes a problem due to the filling profile, or the shape of the area in which the copper is to be filled. This filling profile, which is common to trenches, channels, and vias where copper is used as a conductor material, is such that the copper seed layer is deposited more rapidly on the exposed flat, horizontal surfaces than on the vertical surfaces. Filling trenches, channels, and vias too rapidly then can cause voids to be formed in the copper conductor core leading to reduced conductivity in the current-carrying connections.

Finding a way to change the filling profile so that, despite the non-conformity of copper seed layer, the copper conductor core can be deposited quickly and without voids forming has been long sought but has long eluded those skilled in the art.

DISCLOSURE OF THE INVENTION

The present invention provides a manufacturing method and apparatus for filling vias and trenches in integrated circuits having a semiconductor substrate with a semiconductor device provided thereon. A device dielectric layer is formed on the semiconductor substrate. A channel dielectric layer on the device dielectric layer has an opening provided therein. A barrier layer lines the channel opening. A seed layer is deposited over the barrier layer. Portions of the seed layer are then doped with an inhibiting material using ion implantation. A conductor core layer is deposited on the doped seed layer, filling the opening over the barrier layer and connecting to the semiconductor device. The seed and barrier layers are then removed above the dielectric layer with a CMP process. The inhibiting material on the doped seed layer creates a filling profile that allows for a more efficient, faster, void-free filling of the conductor core layer.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
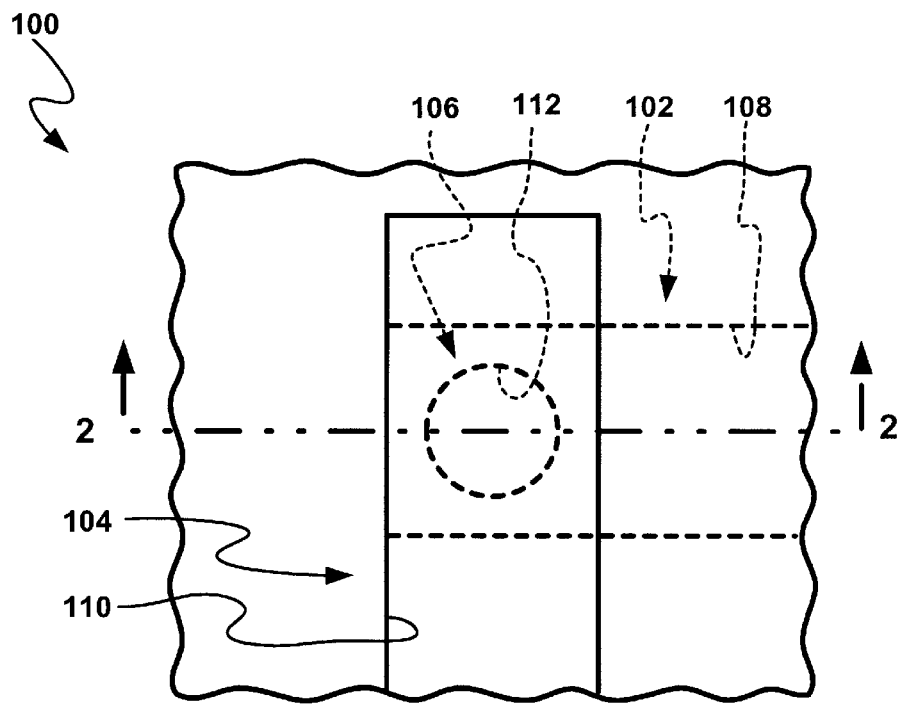
FIG. 1 (PRIOR ART) is a plan view of aligned channels with a connecting via.

Referring now to FIG. 1 (PRIOR ART), therein is shown a plan view of a semiconductor wafer 100 with a silicon semiconductor substrate (not shown) having as interconnects first and second channels 102 and 104 connected by a via 106. The first and second channels 102 and 104 are respectively disposed in first and second channel dielectric layers 108 and 110. The via 106 is an integral part of the second channel 104 and is disposed in a via dielectric layer 112.

The term "horizontal" as used in herein is defined as a plane parallel to the conventional plane or surface of a wafer, such as the semiconductor wafer 100, regardless of the orientation of the wafer. The term "vertical" refers to a direction perpendicular to the horizontal as just defined. Terms, such as "on", "above", "below", "side" (as in "sidewall"), "higher", "lower", "over", and "under", are defined with respect to the horizontal plane.

Figure 2:
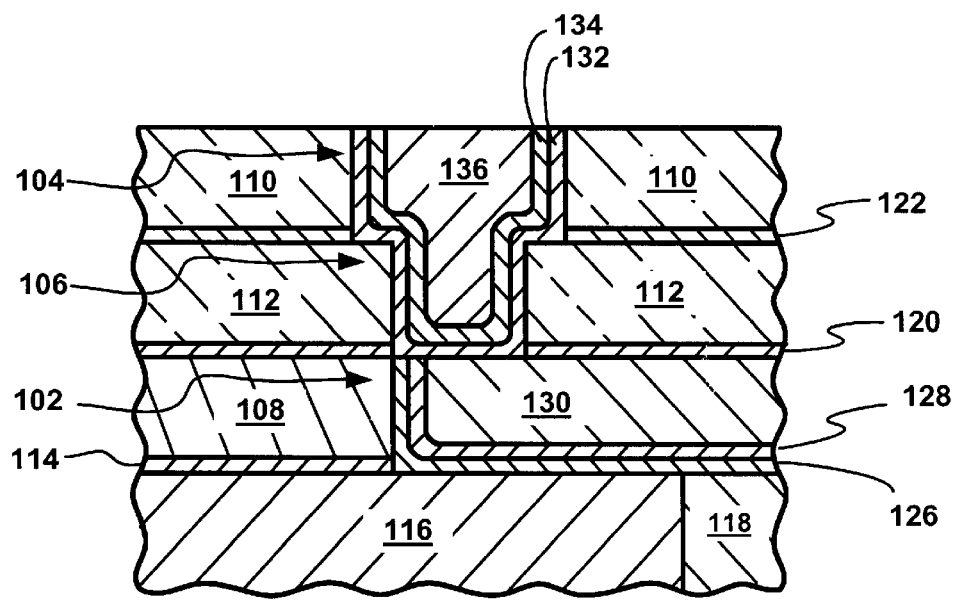
FIG. 2 (PRIOR ART) is a cross-section of FIG. 1 (PRIOR ART) along line 2—2.

Referring now to FIG. 2 (PRIOR ART), therein is shown a cross-section of FIG. 1 (PRIOR ART) along line 2—2. A portion of a first channel 102 is disposed in a first channel stop layer 114 and is on a device dielectric layer 116, which is on the silicon semiconductor substrate. Generally, metal contacts are formed in the device dielectric layer 116 to connect to an operative semiconductor device (not shown). This is represented by the contact of the first channel 102 with a semiconductor contact 118 embedded in the device dielectric layer 116. The various layers above the device dielectric layer 116 are sequentially: the first channel stop layer 114, the first channel dielectric layer 108, a via stop layer 120, the via dielectric layer 112, a second channel stop layer 122, and the second channel dielectric layer 110.

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136. The barrier layers 126 and 132 are used to prevent diffusion of the conductor materials into the adjacent areas of the semiconductor device. The seed layers 128 and 134 form electrodes on which the conductor material of the conductor cores 130 and 136 is deposited. The seed layers 128 and 134 are of substantially the same conductor material as the conductor cores 130 and 136 and become part of the respective conductor cores 130 and 136 after the deposition.

Figure 3A:
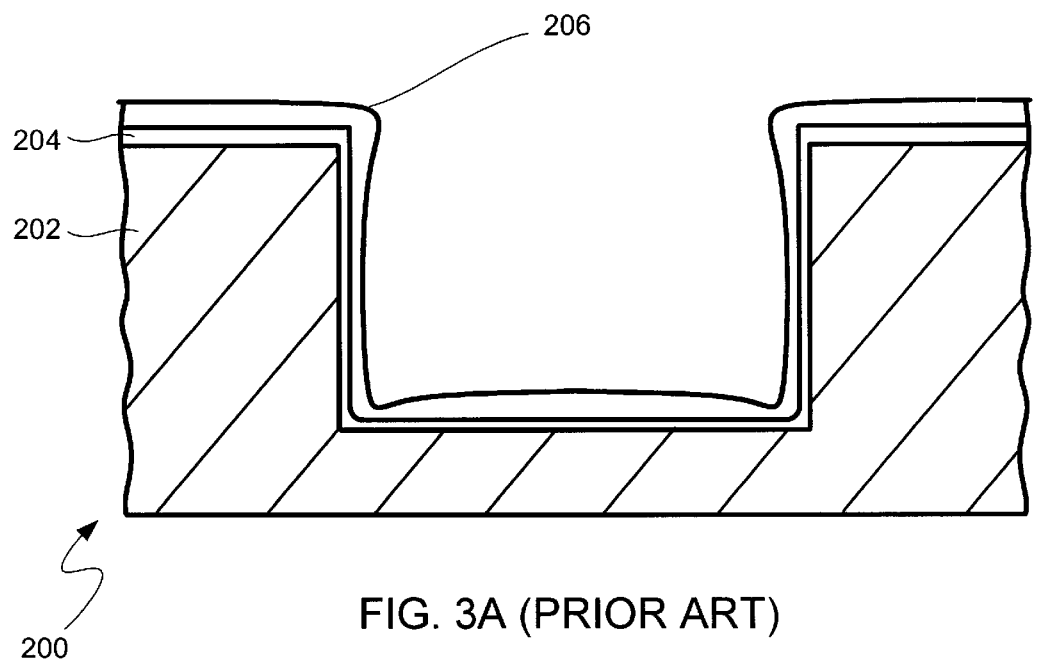
FIG. 3A (PRIOR ART) is a conventional channel after the deposition of a seed layer.

Referring now to FIG. 3A (PRIOR ART), therein is shown a step in the processing of a conventional channel 200 in a semiconductor wafer. Therein is thus shown a dielectric layer 202 with a barrier layer 204 conformally deposited thereon using an ionized PVD process such as self-ionized plasma (SIP) or chemical vapor deposition (CVD) process. A thin copper seed layer 206 has been deposited over the barrier layer 204 using a deposition process which includes ionized plasma vapor deposition (PVD) processes such as SIP. Because PVD copper is a non-conformal material, it does not conform to the barrier layer 204 in a uniform manner, tending to clump to the horizontal portions of the surface of the seed layer 206.

Figure 3B:
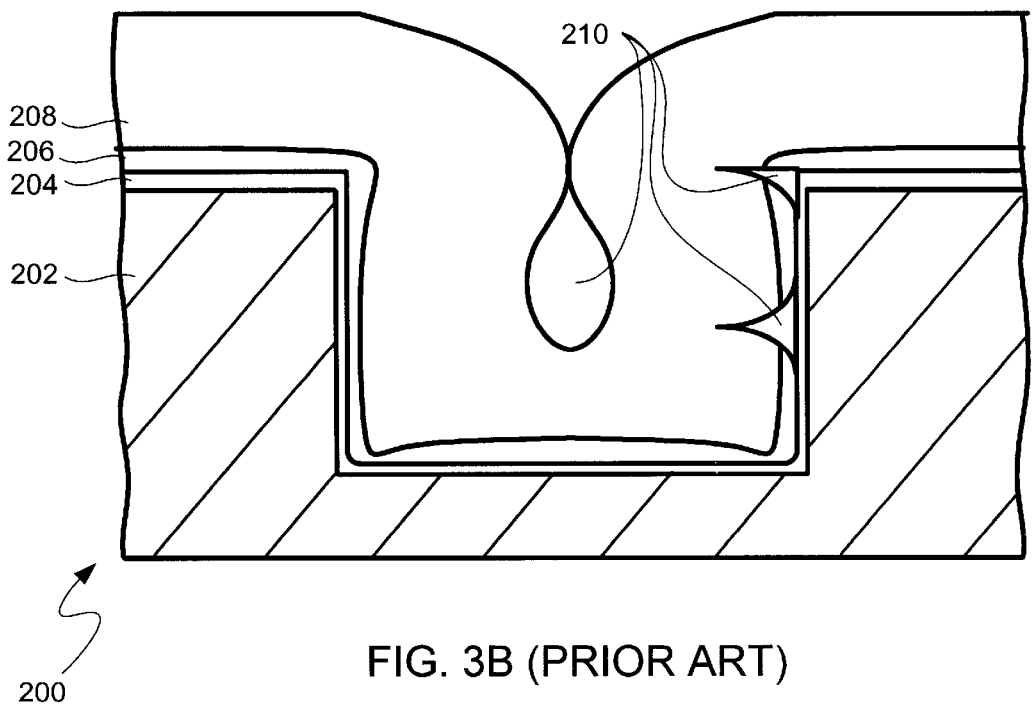
FIG. 3B (PRIOR ART) is a conventional channel which has formed voids during the filling of the conductor core.

Referring now to FIG. 3B (PRIOR ART), therein is shown the conventional channel 200 of FIG. 3A (PRIOR ART) near the conclusion of the deposition of a copper conductor core 208. The copper conductor core 208 includes material from the seed layer 206. The pattern in which the channel 200 is filled is referred to as the filling profile. Because of the uneven formation of copper in conventional filling profiles, voids 210 can form. With current methodology, in order to ensure that voids do not form, the time of the deposition process and copper anneal process would be drastically increased. A faster deposition time would increase the chances of voids like the voids 210 forming. The voids 210 are areas where no conductive material is present and are areas of high resistance, reducing the overall conductivity of the channel.

Figure 3C:
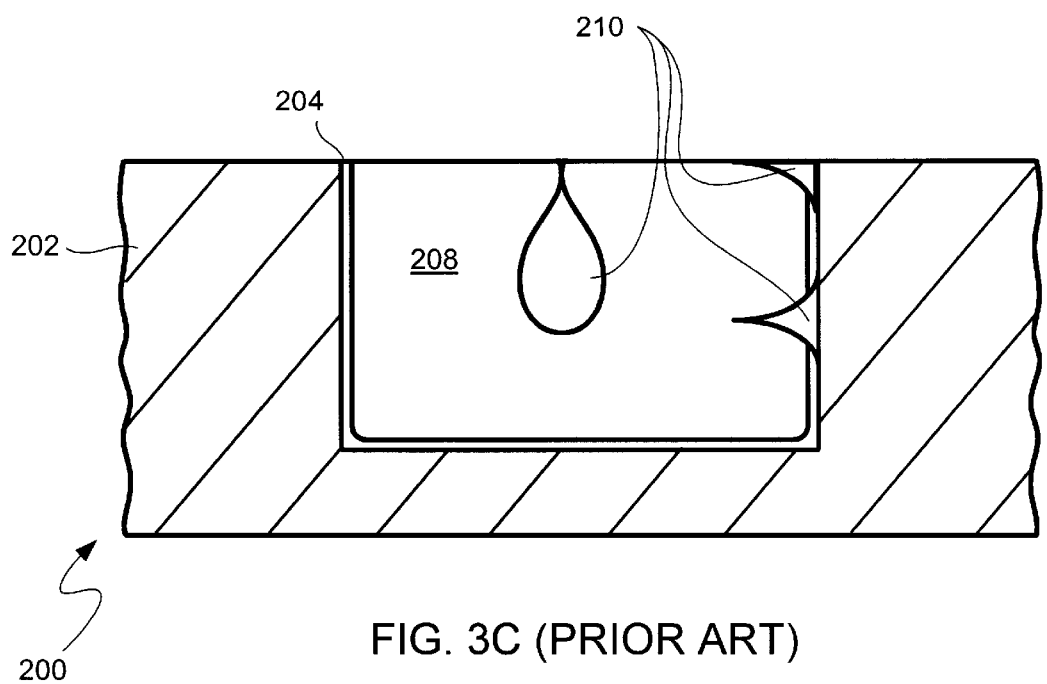
FIG. 3C (PRIOR ART) is a conventional channel with voids in the conductor core after chemical-mechanical polishing.

Referring now to FIG. 3C (PRIOR ART), therein is shown the conventional channel 200 of FIGS. 3A and 3B (PRIOR ART) after chemical-mechanical polishing (CMP) has removed all the material above the top of the channel 200. The voids 210 remain in the copper conductor core 208 potentially causing problems in the future operation of the circuit.

Figure 4A:
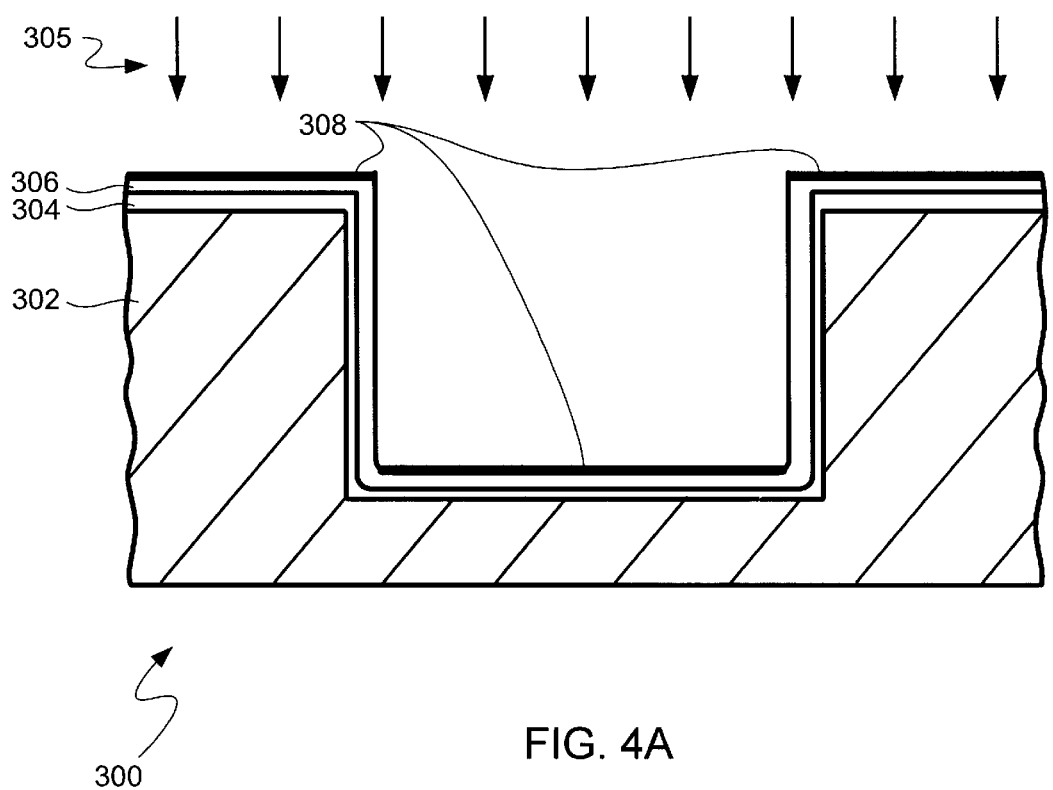
FIG. 4A is a channel of the present invention showing ion implantation.

Referring now to FIG. 4A, therein is shown a step in the formation of a channel 300 of the present invention. A dielectric layer 302 has a barrier layer 304 deposited thereon using an SIP or CVD process. As in the conventional case, a thin copper seed layer 306 is then deposited over the barrier layer 304, also using an SIP process. In order to avoid the problems present in conventional incarnations, an inhibiting dopant, such as carbon C, is implanted by an implantation process 305 into the exposed horizontal portions on the surface of the seed layer 306 forming doped surfaces 308. The doped surfaces 308 are doped to 0.1 to 0.05 atomic percent, and inhibit the formation of copper deposited by electroplating or electroless deposition.

Figure 4B:
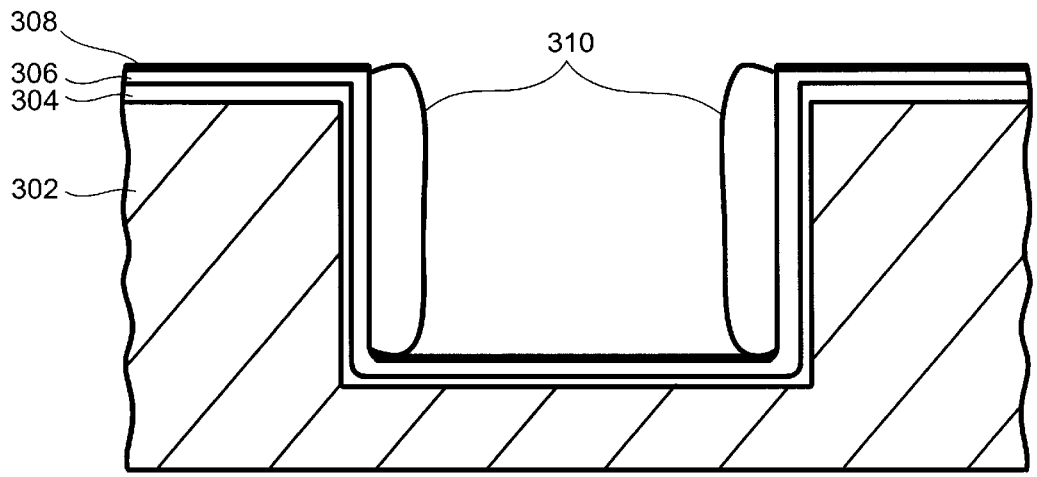
FIG. 4B is a channel of the present invention showing void-free filling of the conductor core.

Referring now to FIG. 4B, therein is shown the channel 300 of the present invention shown in FIG. 4A during the deposition of a copper conductor core 310 by an electroplating or electroless deposition process. Because the doped surfaces 308 inhibit the formation of copper, the formation of copper during the copper deposition process is primarily confined to the undoped surfaces of the seed layer 306. Because electroplating copper on the sidewalls of the seed layer 306 occurs much faster than on the horizontal surfaces 308 of the copper seed layer 306, the filling profile in the present invention, allows for the filling of the channel 300 in a way that eliminates the risk of voids such as the voids 210 in FIGS. 3A and 3B (PRIOR ART). Without such a risk, the filling of channels with copper can occur much more rapidly.

Figure 4C:
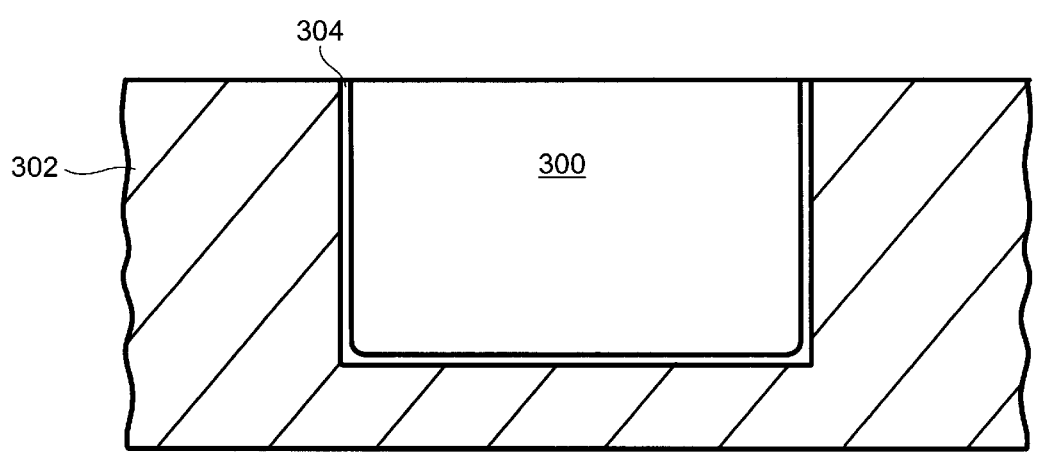
FIG. 4C is a channel of the present invention showing a void-free conductor core after chemical-mechanical polishing.

Referring now to FIG. 4C, therein is shown the channel 300 of the present invention after a plasma process to remove the doped surfaces 308 of the seed layer 306 and after CMP has removed all the material above the top of the channel 300. The channel 300 is completely filled by the conductor core 310 and there are no voids such as the voids 210 in FIG. 3C (PRIOR ART) potentially causing problems in the future operation of the circuit.

Figure 5A:
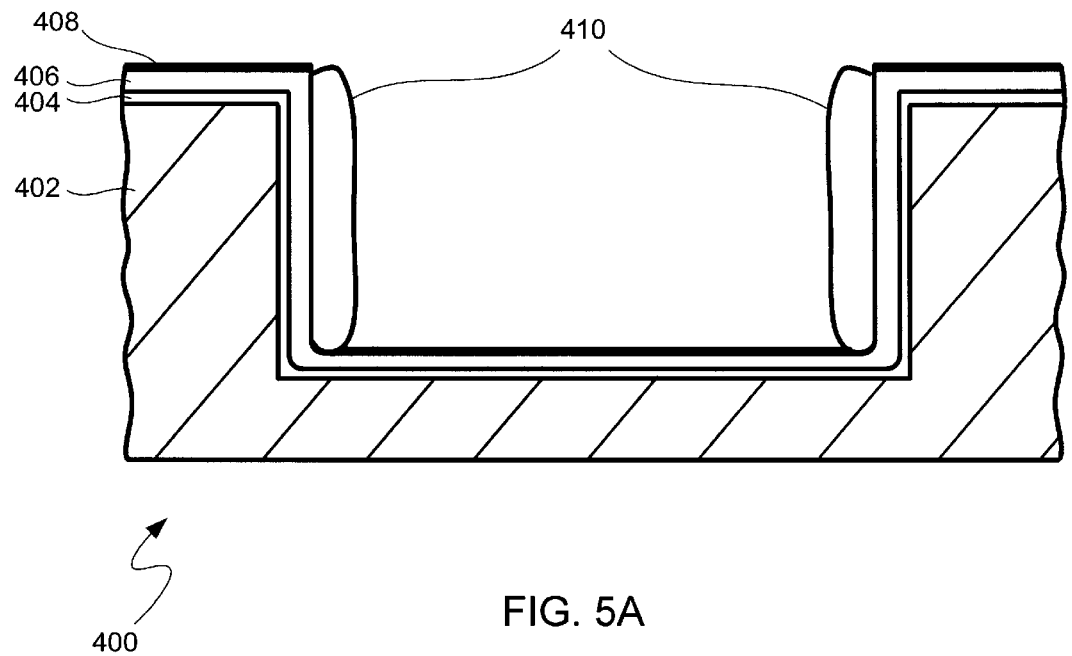
FIG. 5A is a wide channel showing partial filling of the conductor core after ion implantation.

Referring now to FIG. 5A, therein is shown a wide channel 400 of the present invention. With the wide channel 400 or trench where filling the trench with a copper by forming copper on the sidewalls is too lengthy of a process because of the width of the channel, a hybrid approach can be used. A dielectric layer 402 has a barrier layer 404 deposited thereon using an SIP or CVD process. As in FIG. 4, a first thin copper seed layer 406 is then deposited over the barrier layer 404, also using a SIP or CVD process. An inhibiting dopant, such as carbon C, is implanted into the exposed horizontal portions on the surface of the first seed layer 406 forming doped surfaces 408. Initial copper 410 is deposited by an electroplating or electroless deposition process. Because the carbon implanted in the doped surfaces 408 inhibits electroplated or electrolessly deposited copper, the filling profile is constrained mostly to the sidewalls of the first seed layer 406 where there is no carbon doping.

Figure 5B:
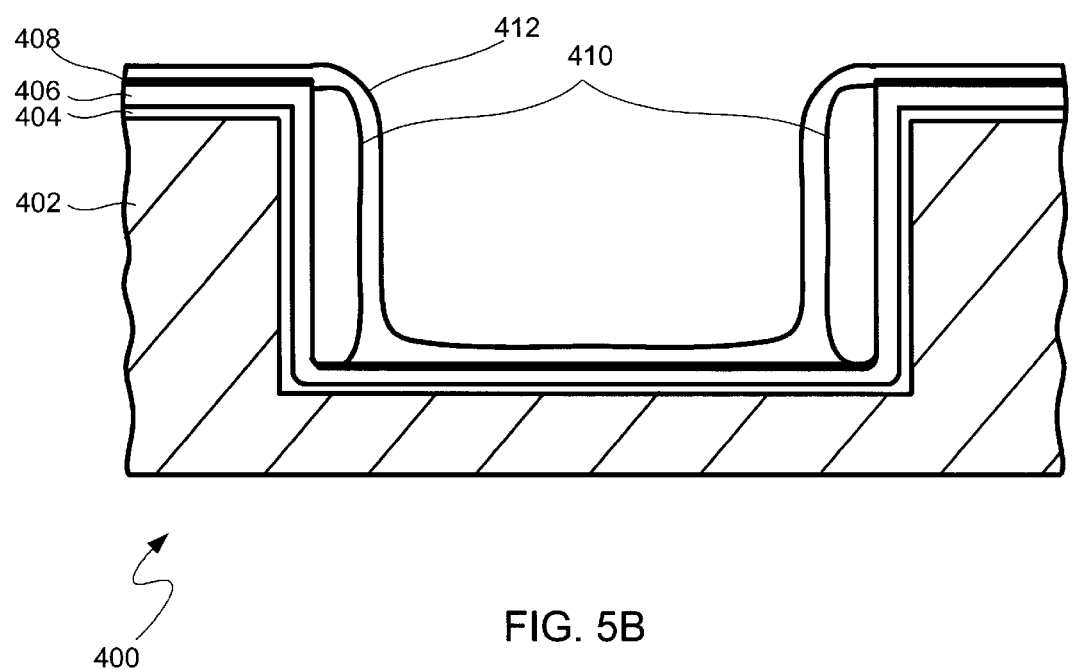
FIG. 5B is a wide channel showing partial filling of the conductor core after deposition of a second seed layer.

Referring now to FIG. 5B, therein is shown the wide channel 400 of FIG. 5A. Because of the width of the channel, continuing with electroplating or electroless deposition of copper becomes a lengthy process. Instead, a second conformal copper seed layer 412 is deposited on top of both the partially formed copper conductor core 410 and the doped surfaces 408 with a SIP or CVD process. This is possible because the doped surfaces 408 only inhibit copper formation when copper is deposited with an electroplating or electroless deposition process. After the second conformal copper seed layer 412 is deposited, a conductor core 414 (shown in FIG. 5C) is completed by depositing copper via a electroplating or electroless deposition process.

Figure 5C:
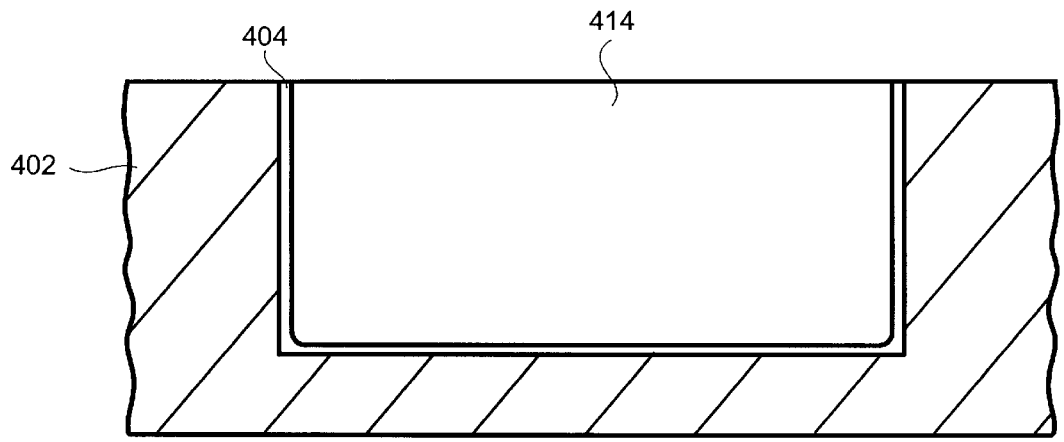
FIG. 5C is a wide channel of the present invention showing a void-free conductor core after chemical-mechanical polishing.

Referring now to FIG. 5C, therein is shown the wide channel 400 of the present invention after (CMP) has removed all the material above the top of the conductor core 414. The wide channel 400 is completely filled by the conductor core 410 which includes the first seed layer 406 and the second conformal copper seed layer 412 and there are no voids such as the voids 210 in FIG. 3C (PRIOR ART) potentially causing problems in the future operation of the circuit.

Figure 6:
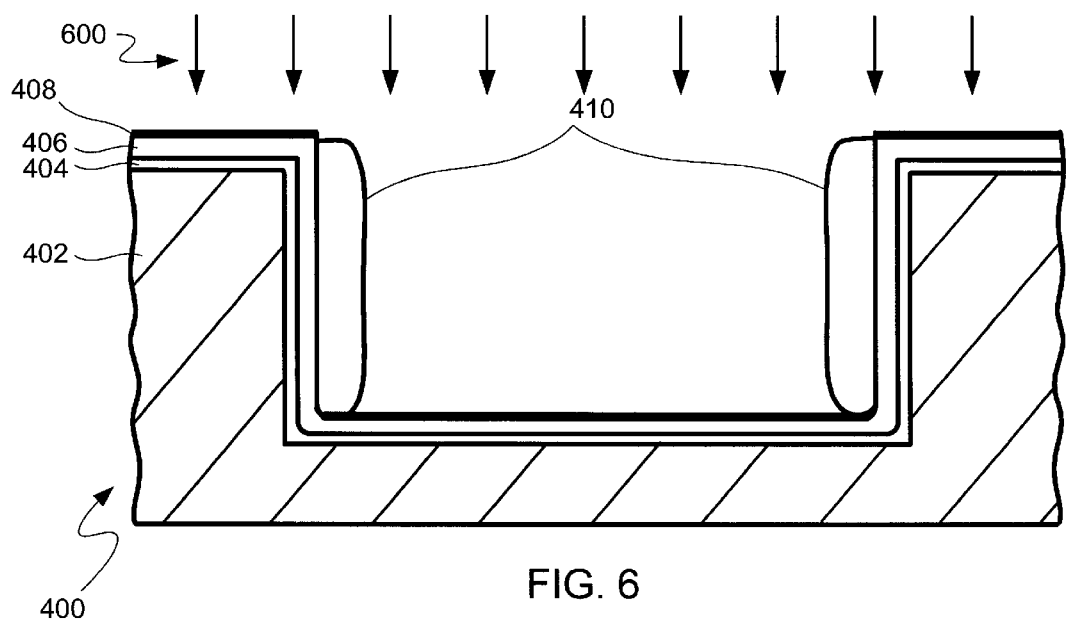
FIG. 6 is a channel of the present invention shown on FIG. 4B and including a step of removal of carbon-doped surfaces after thin copper deposition on vertical surfaces.

Referring now to FIG. 6, therein is shown an alternate embodiment of FIG. 4A in which the carbon-doped surfaces can be removed by argon sputtering or oxygen ($O_2$) plasma 600 prior to further processing. An ammonia ($NH_4$) plasma process can be used to compensate for oxidation that occurs if an oxygen plasma process is used. In this case the doped surfaces are doped to 0.1–1 atomic percent and are removed after the step shown on FIG. 4B of thin copper electroplating or electroless deposition on vertical sidewalls. Then copper filling by electroplating is applied.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. An integrated circuit providing a substrate having a device thereon comprising:
   a dielectric layer formed over the substrate and having an opening in the dielectric layer;
   a barrier layer lining the opening in the dielectric layer;
   a seed layer over the barrier layer, the seed layer having interior surface;
   an inhibiting dopant only on the bottom of the interior surface of the seed layer; and
   a conductor core layer over the seed layer, filling the opening in the dielectric layer and connected to the device.

2. The integrated circuit as claimed in claim 1 wherein the seed layer has no inhibiting dopant distal from the interior surface.

3. The integrated circuit as claimed in claim 1 wherein the inhibiting dopant is a material that inhibits copper deposition by electroplating or electroless deposition.

4. The integrated circuit as claimed in claim 1 wherein the inhibiting dopant is carbon.

5. The integrated circuit as claimed in claim 1 wherein the inhibiting dopant has a concentration of between 0.1 and 0.5 atomic percent.

6. An integrated circuit providing a substrate having a device thereon comprising:
- a dielectric layer formed over the substrate and having an opening provided in the dielectric layer;
- a barrier layer lining the opening in the dielectric layer;
- a first seed layer over the barrier layer, the first seed layer having an interior surface;
- an inhibiting dopant only on the bottom of the interior surface of the first seed layer;
- a first conductor core layer over the seed layer, partially filling the opening in the dielectric layer;
- a second seed layer over the first conductor core; and
- a second conductor core over the second seed layer, fully filling the opening in the dielectric layer and connected to the device.

7. The integrated circuit as claimed in claim 6 wherein the first seed layer has no inhibiting dopant distal from the interior surface.

8. The integrated circuit as claimed in claim 6 wherein the inhibiting dopant is a material that inhibits copper deposition by electroplating or electroless deposition.

9. The integrated circuit as claimed in claim 6 wherein the inhibiting dopant is carbon.

10. The integrated circuit as claimed in claim 6 wherein the inhibiting dopant has a concentration of between 0.1 and 0.5 atomic percent.

* * * * *